(12) United States Patent
White (10) Patent No.: US 11,645,518 B2
(45) Date of Patent: May 9, 2023

(54) MULTI-AGENT SIMULATIONS (71) Applicant: Waymo LLC, Mountain View, CA (US)

(72) Inventor: Brandyn Allen White, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 746 days.

(21) Appl. No.: 16/668,905

(22) Filed: Oct. 30, 2019

(65) Prior Publication Data
US 2021/0104171 A1    Apr. 8, 2021

Related U.S. Application Data (60) Provisional application No. 62/911,623, filed on Oct. 7, 2019.

(51) Int. Cl.
G06N 3/00     (2006.01)
G06N 3/08     (2023.01)

(52) U.S. Cl.
CPC ..................................... G06N 3/08 (2013.01)

(58) Field of Classification Search
CPC ........................................................ G06N 3/08
See application file for complete search history.

(56) References Cited

U.S. PATENT DOCUMENTS

2016/0232440 A1   8/2016  Gregor et al.
2018/0032039 A1   2/2018  Huynh et al.
2018/0032864 A1   2/2018  Graepel et al.
2018/0268624 A1   9/2018  Remboski et al.
(Continued)

FOREIGN PATENT DOCUMENTS

WO    WO2020065024 A1 *  9/2018  ............... G06N 3/00

OTHER PUBLICATIONS

J. Li, H. Ma and M. Tomizuka, "Interaction-aware Multi-agent Tracking and Probabilistic Behavior Prediction via Adversarial Learning," 2019 International Conference on Robotics and Automation (ICRA), 2019, pp. 6658-6664, doi: 10.1109/ICRA.2019.8793661. (Year: 2019).*

(Continued)

Primary Examiner — Elaine Gort
Assistant Examiner — Brittany Renee Peko
(74) Attorney, Agent, or Firm — Fish & Richardson P.C.

(57) ABSTRACT

Methods, systems, and apparatus, including computer programs encoded on a computer storage medium, for generating a simulation of an environment that is being interacted with by a plurality of agents over a plurality of time steps, wherein the simulation comprises a respective simulation state for each time step that specifies a respective state of each agent at the time step. In one aspect, a method comprises, for each time step: obtaining a current simulation state for the current time step; generating a plurality of candidate next simulation states for a next time step; determining, for each candidate next simulation state, a discriminative score characterizing a likelihood that the candidate next simulation state is a realistic simulation state; and selecting a candidate next simulation state as the simulation state for the next time step based on the discriminative scores for the candidate next simulation states.

20 Claims, 6 Drawing Sheets

MULTI-AGENT ENVIRONMENT 100

(56) References Cited

U.S. PATENT DOCUMENTS

| | | | |
|---|---|---|---|
| 2019/0310654 A1* | 4/2019 | Halder | G05D 1/0274 |
| 2019/0266475 A1 | 8/2019 | Wierstra et al. | |
| 2020/0104680 A1* | 4/2020 | Reed | G06N 3/0454 |
| 2020/0180647 A1* | 6/2020 | Anthony | B60W 50/0097 |
| 2020/0353943 A1* | 11/2020 | Siddiqui | B60W 50/06 |
| 2020/0391738 A1* | 12/2020 | Isele | B60W 30/16 |
| 2022/0126864 A1* | 4/2022 | Moustafa | B60W 60/0013 |

OTHER PUBLICATIONS

PCT International Search Report and Written Opinion in International Appln. No. PCT/US2020/054227, dated Feb. 2, 2021, 10 pages.

Battacharyya et al, "Multi-Agent Imitation Learning for Driving Simulation," arXiv, Mar. 2, 2018, 6 pages.

Fu et al, "Learning robust rewards with adversarial inverse reinforcement learning," arXiv, Aug. 13, 2018, 15 pages.

Ghosh et al, "Multi-Agent Diverse Generative Adversarial Network," arXiv, Jul. 16, 2018, 17 pages.

Ho et al, "Generative Adversarial Imitation Learning," arXiv, Jun. 10, 2016, 14 pages.

Siebers et al, "Introduction to Multi-Agent Simulation," arXiv, 2008, 25 pages.

Song et al, "Multi-Agent Generative Adversarial Imitation Learning," arXiv, Jul. 26, 2018, 23 pages.

U.S. Appl. No. 62/911,183, White., Spatio-Temporal Pose/ Object Database, filed Oct. 4, 2019, 36 pages.

International Preliminary Report on Patentability in International Appln. No. PCT/US2020/054227, dated Apr. 12, 2022, 7 pages.

* cited by examiner

MULTI-AGENT ENVIRONMENT 100

FIG. 1

SIMULATION ROLL-OUTS 200

OCCUPANCY MAPS 400

MULTI-AGENT SIMULATIONS

CROSS-REFERENCE TO RELATED APPLICATION

This application claims priority under 35 U.S.C. 119 to Provisional Application No. 62/911,623, filed Oct. 7, 2019, all of which are incorporated by reference.

BACKGROUND

This specification relates to using machine learning models to simulate an environment.

Machine learning models receive an input and generate an output, e.g., a predicted output, based on the received input. Some machine learning models are parametric models and generate the output based on the received input and on values of the parameters of the model.

Some machine learning models are deep models that employ multiple layers of models to generate an output for a received input. For example, a deep neural network is a deep machine learning model that includes an output layer and one or more hidden layers that each apply a non-linear transformation to a received input to generate an output.

SUMMARY

This specification describes a simulation system implemented as computer programs on one or more computers in one or more locations that can learn to control a set of agents interacting with a simulated environment to cause their behavior to realistically simulate the behavior of real-world agents.

According to a first aspect there is provided a method performed by one or more data processing apparatus for generating a simulation of an environment that is being interacted with by a set of agents over a sequence of time steps. The simulation includes a respective simulation state for each time step that specifies a respective state of each agent at the time step. The method includes, for each time step, obtaining a current simulation state for the current time step. A set of candidate next simulation states for a next time step are generated based on the current simulation state. Generating each candidate next simulation state includes sampling, for each agent, a respective action from a set of possible actions that can be performed by the agent. For each agent, a respective next state of the agent at the next time step if the agent performs the corresponding sampled action at the current time step is determined. For each candidate next simulation state, a discriminative score characterizing a likelihood that the candidate next simulation state is a realistic simulation state is determined. A candidate next simulation state is selected as the simulation state for the next time step based on the discriminative scores for the candidate next simulation states.

In some implementations, the agents are vehicles in the environment.

In some implementations, the set of possible actions that can be performed by an agent include actions that adjust a steering angle of the agent.

In some implementations, the set of possible actions that can be performed by an agent include actions that adjust an acceleration of the agent.

In some implementations, the state of an agent at a time step includes: (i) a position of the agent at the time step, and (ii) a motion of the agent at the time step.

In some implementations, the position of the agent includes: (i) a spatial location of the agent in the environment, and (ii) a heading of the agent in the environment.

In some implementations, the motion of the agent includes: (i) a speed of the agent, and (ii) an acceleration of the agent.

In some implementations, the method further includes, for each agent, obtaining a representation of the current state of the agent in the environment, and processing the representation of the current state of the agent in the environment using a policy neural network to generate a corresponding probability distribution over the set of possible actions for the agent. Sampling, for each agent, a respective action from the set of possible actions may include, for each agent, sampling an action from the set of possible actions in accordance with the probability distribution over the set of possible actions for the agent.

In some implementations, determining, for each agent, a respective next state of the agent at the next time step if the agent performs the corresponding sampled action at the current time step includes, for each agent, processing data characterizing: (i) a current state of the agent, and (ii) the sampled action for the agent, using a motion model to generate the next state of the agent at the next time step.

In some implementations, determining a discriminative score characterizing a likelihood that a candidate next simulation state is a realistic simulation state includes obtaining a representation of the candidate next simulation state. The representation of the candidate next simulation state may be processed using a discriminator neural network to generate the discriminative score characterizing the likelihood that the candidate next simulation state is a realistic simulation state.

In some implementations, obtaining a representation of the candidate next simulation state includes obtaining, for each agent, a representation of the next state of the agent at the next time step corresponding to the candidate next simulation state. Processing the representation of the candidate next simulation state using a discriminator neural network may include, for each agent, processing the representation of the next state of the agent at the next time step corresponding to the candidate next simulation state using the discriminator neural network to generate an agent-specific discriminative score characterizing a likelihood that the next state of the agent is a realistic agent state. The discriminative score characterizing the likelihood that the candidate next simulation state is a realistic simulation state may be generated based on the agent-specific discriminative scores.

In some implementations, generating the discriminative score characterizing the likelihood that the candidate next simulation state is a realistic simulation state based on the agent-specific discriminative scores includes computing a minimum of the agent-specific discriminative scores.

In some implementations, the discriminator neural network is trained to generate discriminative scores that characterize an environment state as being realistic if the environment state is a real-world environment state.

In some implementations, selecting a candidate next simulation state as the simulation state for the next time step based on the discriminative scores for the candidate next simulation states includes selecting the candidate next simulation state with the highest discriminative score as the simulation state for the next time step.

According to a second aspect there is provided a system including one or more computers and one or more storage devices communicatively coupled to the one or more computers, where the one or more storage devices store instructions that, when executed by the one or more computers, cause the one or more computers to perform the operations of the method of the first aspect.

According to a third aspect there are provided one or more non-transitory computer storage media storing instructions that when executed by one or more computers cause the one or more computers to perform the operations of the method of the first aspect.

Particular embodiments of the subject matter described in this specification can be implemented so as to realize one or more of the following advantages.

This specification describes a simulation system that can control a set of multiple simulated agents (e.g., vehicles) interacting with an environment to cause their behavior to realistically simulate the behavior of real-world agents (e.g., vehicles controlled by human drivers). The simulation system can be used to improve the operation of a planning system that selects actions to be performed by a partly- or fully-autonomous vehicle. For example, the simulation system can be used to generate a large number of simulations where the planning system controls one vehicle while the remaining vehicles are controlled by the simulation system. These simulations can be used to identify and resolve potential "bugs" in the planning system (e.g., where the planning system selects actions that cause the vehicle to operate unsafely) before the planning system is used to control a vehicle in a real-world environment. As another example, a planning system of a vehicle can use the simulation system to predict the possible future behavior of other vehicles in an environment, and thereafter use these behavior predictions to control the operation of the vehicle more safely and effectively. As another example, the simulation system can be used to train a planning system to select actions that enable a vehicle to operate safely, efficiently, and comfortably, in environments that are simultaneously occupied by other vehicles.

Previously, to test the performance of a planning system, a simulation could be generated where the planning system would control one vehicle and the remaining vehicles would simply replay logged behavior of real-world vehicles. Such simulations may be unrealistic, since the vehicles following predetermined trajectories are unable to adjust their behavior to account for the behavior of the vehicle controlled by the planning system. In contrast, the simulation system described in this specification can dynamically select the actions to be performed by each vehicle under its control at each time step while accounting for the behavior of each other vehicle, i.e., including the vehicle controlled by the planning system. Therefore, the simulation system described in this specification can generate more realistic simulations that can be used to improve the operation of a planning system.

The simulation system described in this specification can "sample" (i.e., stochastically generate) a large number of possible simulations of an environment starting from a given initial condition of the environment. Sampling different possible simulations enables the simulation system to simulate many different scenarios, e.g., where a vehicle controlled by the simulation system merges behind a vehicle controlled by the planning system, and where the vehicle controlled by the simulation system merges ahead of the vehicle controlled by the planning system. In contrast, an alternative simulation system where vehicles replay logged behavior of real-world vehicles would be unable to simulate multiple scenarios starting from a given initial condition. The ability to sample different possible simulation scenarios enables the simulation system described in this specification to be used, e.g., for testing a planning system under a more comprehensive set of realistic scenarios than would be possible using some alternative simulation systems.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
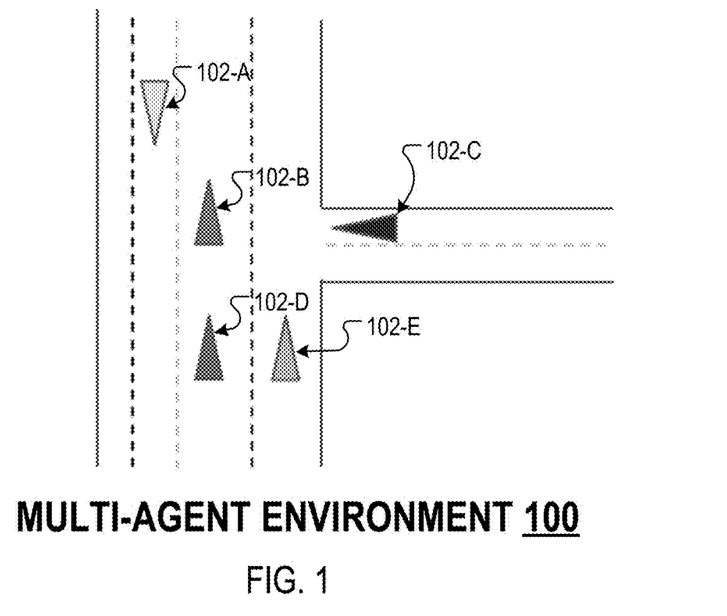
FIG. 1 illustrates an example environment being interacted with by multiple agents.

This specification describes a simulation system that can learn to control a set of agents (e.g., vehicles) interacting with a simulated environment to cause their behavior (e.g., acceleration and steering) to simulate the behavior of real-world agents (e.g., cars controlled by human drivers). The simulation system jointly controls the agents to cause each agent to behave realistically, both individually and with respect to each of the other agents in the environment. Take, as an example, the simulated multi-agent environment 100 illustrated by FIG. 1, where five agents (102-A-E) are jointly navigating a roadway. The simulation system may cause agent 102-C to stop at the intersection, and to refrain from entering the lane occupied by agent 102-E until after agent 102-E (which is also controlled by the simulation system) has passed the intersection. When agent 102-C does enter the intersection, the simulation system can control its steering and acceleration to cause it to follow a realistic trajectory, e.g., such that it stays on the roadway and does not collide with any of the other agents.

Throughout this document, the behavior of an agent is said to be "realistic" if it simulates (i.e., has similar properties to) the behavior of real-world agents. For example, an agent may be considered to behave realistically based on whether it collides with other objects in the environment, how it handles traffic control lights and signs (e.g., all-way stop precedence), and how it handles interactions with other agents (e.g., during lane changes and merging). Similarly, the state of an environment (or an agent) is said to be realistic if it simulates the states of real-world environments (or agents). Put another way, a simulation is said to be realistic if it specifies simulation states that have similar characteristics to real-world environment states derived from logged data, such that an observer (e.g., a discriminator neural network or a person) may have difficulty distinguishing the simulation states from the real-world environment states.

The simulation system controls the agents by selecting a respective action to be performed by each agent at each of multiple time steps. In particular, for each agent, the system can use a "policy" neural network to generate a probability distribution over a set of possible actions, and then select the action to be performed by the agent using the probability distribution. The actions that can be performed by an agent may include actions that control the motion of the agent, e.g., steering and acceleration actions, and actions that otherwise affect the state of the agent, e.g., by activating or deactivating turns signals. The actions performed by the agents at a given time step determine the state of the simulation (in particular, the respective state of each agent) at the next time step. As used throughout this document, a "simulation state" at a time step refers to data that characterizes the state of each agent at the time step.

Starting from a given initial simulation state at a first time step, the simulation system generates a set of multiple "candidate" next simulation states for the next time step. Each candidate next simulation state is the result of the agents performing respective actions that are sampled from the per-agent action probability distributions generated by the policy neural network at the first time step. The simulation system evaluates whether each candidate next simulation state is realistic by generating a respective "discriminative score" for the candidate next simulation state using a "discriminator" neural network. The simulation system can use the discriminative scores to filter (i.e., remove from further consideration) one or more candidate next simulation states, e.g., by only maintaining the candidate next simulation state with the highest discriminative score, or the candidate next simulation states with discriminative scores satisfying a threshold.

The simulation system "rolls out" the simulation over multiple time steps by, at each time step, generating candidate next simulation states for the next time step based on the simulation state(s) for the current time step, and filtering unrealistic candidate next simulation states based on the discriminative scores. Maintaining multiple candidate next simulation states (i.e., which are each identified as being realistic) can enable the simulation system to roll out multiple simulations in parallel.

Figure 2:
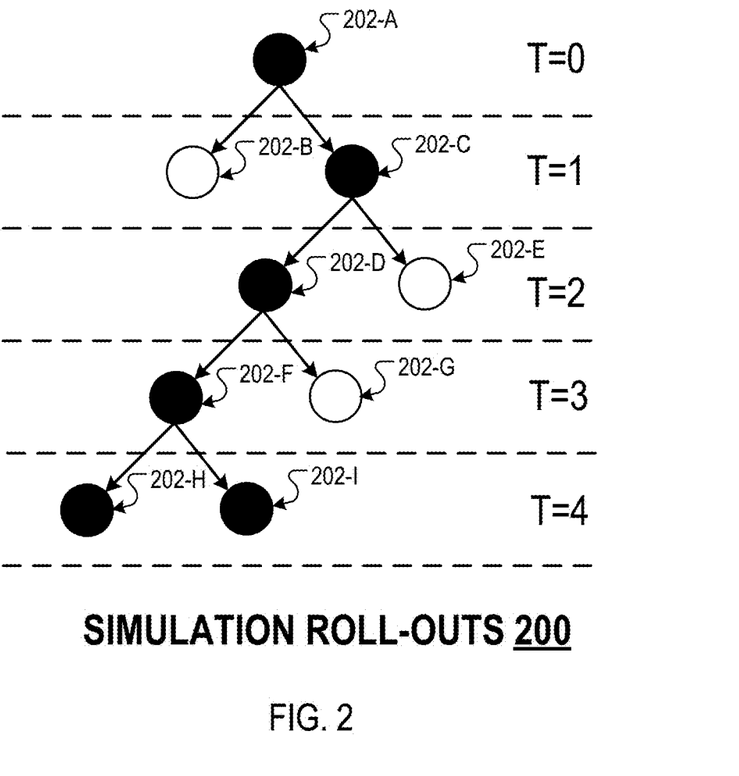
FIG. 2 illustrates an example of a simulation that has been rolled out over 4 time steps.

FIG. 2 illustrates an example of a simulation 200 that has been rolled out over 4 time steps (T=1, 2, 3, 4) starting from an initial time step (T=0). Each of the circles 202-A-I represent a respective simulation state generated by the simulation system. At T=0, the simulation system generates two candidate next simulation states 202-B and 202-C from the initial simulation system 202-A. The simulation system generates discriminative scores for the candidate simulation states 202-B and 202-C, and in this example, filters the candidate simulation state 202-B. In FIG. 2, unfilled circles (e.g., 202-B) represent simulation states that have been filtered, while filled-in circles (e.g., 202-C) represent simulation states that have been maintained by the simulation system. The simulation system proceeds to generate candidate simulation states 202-D and 202-E from candidate simulation state 202-C, filter candidate simulation state 202-D, generate candidate simulation states 202-F and 202-G, filter candidate simulation state 202-G, and generate candidate simulation states 202-H and 202-I (filtering neither). In this example, the simulation system generates two possible simulations of the agents in the environment, corresponding to the sequences of simulation states: [A, C, D, F, H] and [A, C, D, F, I].

The simulation system described in this specification can be used for any of a variety of purposes. In one example, the simulation system can be used to assess whether a planning system of a vehicle (i.e., that is configured to make driving decisions that control the operation of the vehicle) is able to safely and effectively control the vehicle, e.g., during lane changes and merging interactions. In another example, the simulation system can be used by a planning system of a vehicle during operation of the vehicle, e.g., to predict the behavior of other agents in the vicinity of the vehicle.

These features and other features are described in more detail below.

Figure 3:
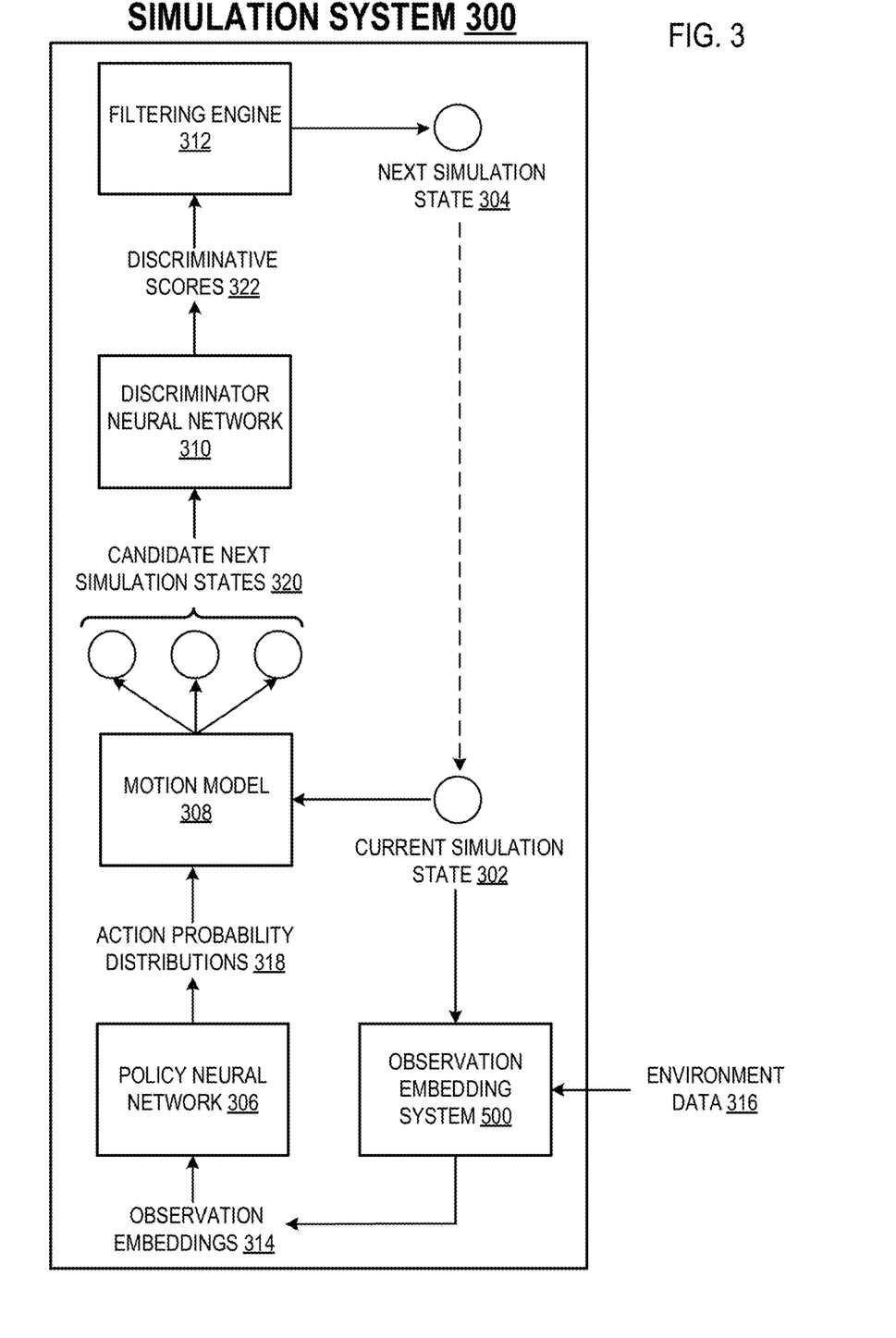
FIG. 3 is a block diagram of an example simulation system.

FIG. 3 is a block diagram of an example simulation system 300. The simulation system 300 is an example of a system implemented as computer programs on one or more computers in one or more locations in which the systems, components, and techniques described below are implemented.

The simulation system 300 is configured to generate one or more simulations of an environment (e.g., a roadway) that is being interacted with by one or more agents (e.g., vehicles) over multiple time steps. Each simulation of the environment specifies a sequence of simulation states, where each simulation state corresponds to a respective time step, and the simulation state for a time step characterizes the state of each agent at the time step. The state of an agent at a time step may specify, e.g., the position and the motion of the agent at the time step. The position of an agent may specify the spatial location of the agent in the environment (e.g., represented by a set of x-y coordinates) and the heading (direction of travel) of the agent (e.g., represented by an angle in the range $[0, 2\pi]$ radians). The motion of an agent may specify the speed of the agent (e.g., in miles-per-hour) and the acceleration of the agent (e.g., in feet-per-second-squared). The state of an agent at a time step may also characterize other aspects of the agent, e.g., the turn signal status of the agent at the time step. Each simulation may specify further information characterizing the environment being interacted with by the agents, e.g., road graph data indicating the positions of various static features of the environment (e.g., lanes), and data indicating the states of objects in the environment (e.g., traffic lights) at different time points.

At each of multiple time steps, the simulation system 300 processes one or more current simulation states 302 for the current time step to generate one or more next simulation states 304 for the next time step, where each next simulation state extends a current simulation state. A next simulation state is said to "extend" a current simulation state if it results from each agent performing a respective action in the current simulation state. In the example illustrated in FIG. 2, the simulation states 202-B and 202-C extend the simulation state 202-A. After the final time step, the simulation system 300 identifies one or more simulations of the environment from the generated simulation states. Each simulation specifies a sequence of generated simulation states having the property that each simulation state in the sequence extends the preceding simulation state in the sequence.

The simulation system 300 can process a current simulation state 302 for a current time step to generate one or more next simulation states 304 for the next time step using: an observation embedding system 500, a policy neural network 306, a motion model 308, a discriminator neural network 310, and a filtering engine 312, as will be described in more detail next.

The observation embedding system 500 generates a respective current observation embedding 314 for each agent. The current observation embedding 314 for an agent is an ordered collection of numerical values (e.g., a vector or matrix of numerical values) that characterizes the current state of the agent and the current state of the environment. For example, the current observation embedding for a given agent may characterize the current state of the environment (including the current states of the other agents) from the perspective of the given agent, as will be described in more detail with reference to FIG. 5. The observation embedding system 500 may generate observation embeddings 314 for the agents having a fixed (predetermined) dimensionality, e.g., the observation embedding 314 for each agent may be a 256-dimensional vector.

The observation embedding system 500 can generate the current observation embeddings 314 for the agents by processing the current simulation state 302 and a set of environment data 316 characterizing the current state of the environment. The environment data 316 may include, e.g., a road-graph indicating the structure of the roadway being travelled by the agents (e.g., the positions and types of lanes, road signs, crosswalks, and the like), the states of objects in the environment (e.g., traffic lights), the trajectories of the agents up to the current time point, and the predicted future trajectories of the agents (as will be described in more detail below). An example observation embedding system 500 is described in more detail with reference to FIG. 5.

For each agent, the policy neural network 306 processes the observation embedding 314 for the agent to generate a probability distribution 318 over a set of possible actions that can be performed by the agent. The set of possible actions may include actions that control the motion of the agent and actions that otherwise affect the state of the agent. In one example, the set of possible actions may be given by:

$$A=\{(A_i, S_j): i=1, \ldots, N, j=1, \ldots, M\} \quad (1)$$

where each $A_i$ represents an action that adjusts the acceleration of the agent and each $S_j$ represents an action that adjusts the steering angle of the agent. The policy neural network can have any appropriate neural network architecture that enables it to perform its described function. In one example, the policy neural network may include an input layer, followed by a sequence of multiple fully-connected layers, followed by a soft-max output layer, where each neuron of the soft-max output layer corresponds to a respective action in the set of possible actions.

The simulation system 300 uses the action probability distributions 318 to generate one or more candidate next simulation states 320 that extend the current simulation state 302. To generate a candidate next simulation state 320, the simulation system 300 samples a respective action for each agent from the corresponding action probability distribution 318 for the agent. The simulation system 300 then uses the motion model 308 to compute the state of the agent at the next time step if the agent performs the corresponding sampled action at the current time step. The computed next agent states collectively specify the candidate next simulation state 320. The motion model 308, which may also be referred to as a "dynamics model", a "transition model", or a "physics model", may compute the next state of an agent based on the current state of the agent and the action performed by the agent using the appropriate kinematic and geometric relationships.

The simulation system 300 uses the discriminator neural network 310 to generate a respective discriminative score 322 for each candidate next simulation state 320. The discriminative score 322 for a candidate next simulation state 320 characterizes the likelihood that the candidate next simulation 320 state is realistic. The discriminative score 322 for a candidate next simulation state can be represented as a numerical value, e.g., a numerical value in the range [0,1], e.g., where higher values of the discriminative score (i.e., closer to one) indicate that the candidate next simulation state is more realistic.

Figure 5:
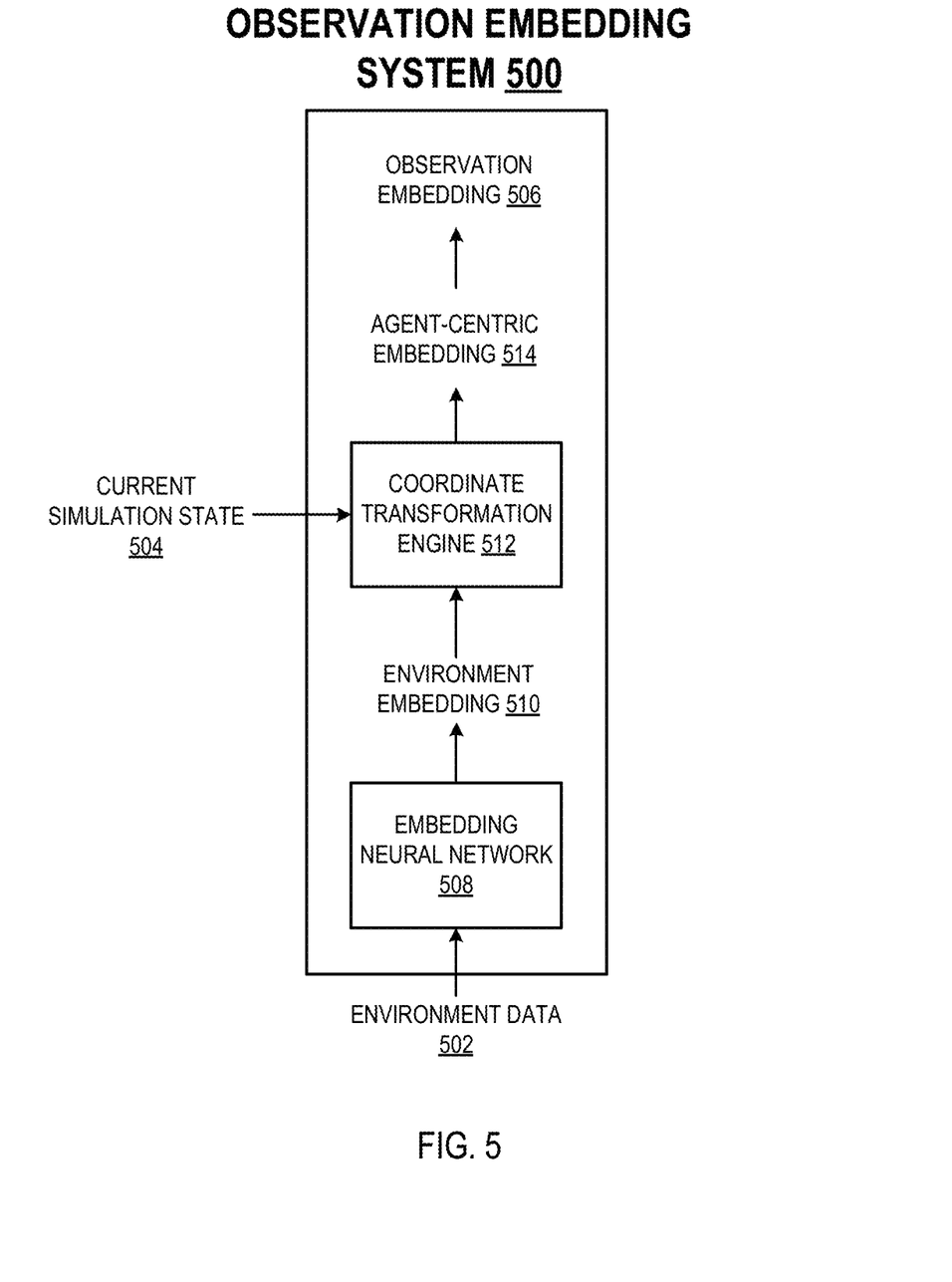
FIG. 5 is a block diagram of an example observation embedding system.

Generally, the simulation system 300 can generate the discriminative score 322 for a candidate next simulation state 320 by using the discriminator neural network 310 to process a representation of the candidate next simulation state 320. In one example, the simulation system 300 may generate the representation of the candidate next simulation state by using the observation embedding system 500 to generate a respective observation embedding for each agent corresponding to the candidate next simulation state 320. In this example, the agent observation embeddings corresponding to the candidate next simulation state 320 collectively specify the representation of the candidate next simulation state. The simulation system 300 may use the discriminator neural network 310 to process each agent observation embedding to generate a respective agent-specific discriminative score for each agent which characterizes the likelihood that the state of the agent is realistic. The simulation system 300 may then combine the agent-specific discriminative scores to generate the overall discriminative score for the candidate next simulation state. For example, the simulation system may generate the discriminative score D for the candidate next simulation state as:

$$D=(\{D_i\}_{i=1}^N) \quad (2)$$

$$D_i=f_\theta(O_i) \quad (3)$$

where N is the number of agents, $D_i$ is the agent-specific discriminative score for agent i, $O_i$ is the observation embedding for agent i corresponding to the candidate next simulation state, and $f_\theta(\cdot)$ represents the operations performed by the discriminator neural network. Determining the discriminative score for the simulation state as the minimum of the agent-specific discriminative scores (i.e., as in equation (2)) reflects the intuition that the behavior of any agent being unrealistic results in the entire simulation state being unrealistic.

Optionally, the discriminator neural network 310 may process other inputs in addition to the representation of the candidate next simulation state 320. For example, the discriminator may process a representation of the current simulation state 302 (and possibly representations of one or more preceding simulation states) in addition to the representation of the candidate next simulation state 320. Processing these additional inputs may enable the discriminator neural network to more accurately characterize whether the candidate next simulation state is realistic.

Generally, the discriminator neural network 310 can have any appropriate neural network architecture that enables it to perform its described function. For example, the discriminator neural network architecture may include a sequence of fully-connected layers followed by an output layer with a single neuron, i.e., where the activation of the output layer neuron specifies the discriminative score. The output layer may use, e.g., a sigmoid activation function, to cause the discriminative scores to fall into the range [0,1].

The simulation system 300 uses the filtering engine 312 to select one or more next simulation states 304 from among the candidate next simulation states 304 based on the discriminative scores 322 for the candidate next simulation states 304. Generally, the filtering engine 312 is more likely to filter (i.e., remove from further consideration) a candidate next simulation state 320 if the discriminative score 322 for the candidate next simulation state indicates that it is not a realistic state, i.e., is a state that is unlikely to occur in a real-world environment. In one example, the filtering engine 312 may filter each candidate next simulation state 320 having a discriminative score 322 that does not satisfy a predetermined threshold. In another example, the filtering engine 312 may filter every candidate next simulation state 320 except for a predefined number of candidate next simulation states 304 having the highest discriminative scores.

In some cases, particularly during training of the simulation system 300 (i.e., when the simulation system 300 has not yet learned to effectively select actions to be performed by the agents), many of the candidate next simulation states may meet the criteria for being filtered by the filtering engine 312. In order to continue rolling out the simulations at the next time step, the simulation system 300 must select at least one next simulation state for the next time step. Therefore, the simulation system 300 may continually generate candidate next simulation states 304 (i.e., that extend the current simulation states 302) until at least a predefined number have been selected by the filtering engine 312 as acceptable next simulation states 304 for the next time step.

After identifying the simulation states 304 for the next time step, the simulation system 300 may proceed to the next time step. If the current time step is the final time step, the simulation system 300 may identify one or more simulations of the environment from the simulation states generated for each time step. The simulation system 300 may determine that the current time step is the final time step if the simulations have been rolled-out for a predefined maximum number of time steps.

Generally, in order to select actions that cause the agents to behave realistically, the simulation system 300 (in particular, the policy neural network 306) may account for the predicted future behavior of the agents. The simulation system 300 may account for the predicted future behavior of the agents in a manner that is purely implicit, e.g., that is implicitly learned and encoded in the parameter values of the policy neural network 306. However, in order to improve the performance of the simulation system 300 and to facilitate the training of the policy neural network 306, the simulation system 300 may also select the actions to be performed by the agents based on explicit predictions for the future behavior of the agents. The explicit predictions for the future behavior of the agents may be provided by one or more previously generated simulations of the environment. For example, the simulation system 300 may iteratively generate simulations of the environment, where at each iteration, the simulation system 300 generates one or more simulations of the environment that take into account the simulations generated at the previous iteration. That is, to generate the simulations at a given iteration, the simulation system can observe the predicted agent behaviors represented by the simulations generated at the previous iteration.

Figure 4:
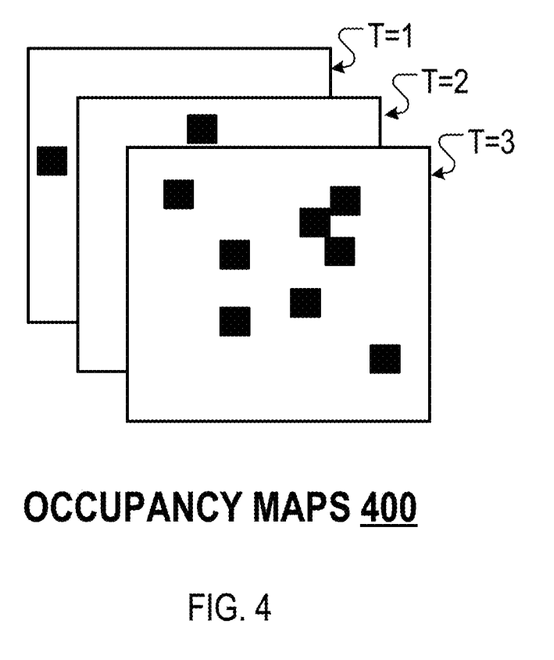
FIG. 4 provides an illustration of a set of occupancy maps.

The simulation system 300 can use simulations generated at a previous iteration in generating the simulations for the current iteration in any of a variety of ways. For example, for each time point, the simulation system 300 can generate a respective "occupancy map" that indicates whether each spatial position in the environment was occupied by an agent at the time point in any of the simulations of the previous iteration. More specifically, the occupancy map for a time point can be represented as a two-dimensional (2D) array of numerical values, where each component of the array corresponds to a respective spatial location in the environment. The value of each component of the array indicates whether the corresponding spatial position in the environment was occupied by an agent at the time point in any of the simulations of the previous iteration. At each iteration, the simulation system 300 can provide the occupancy maps corresponding to the previous iteration as an additional input to the observation embedding system 500 as part of generating the current observation embeddings 314. At the first iteration (for which there are no previous iterations), the simulation system 300 can use default occupancy maps, i.e., having predefined default values. FIG. 4 provides an illustration of a set of occupancy maps 400 for time points T=1, 2, 3, where components of the occupancy maps are shaded to indicate that the corresponding spatial location in the environment was occupied by an agent in one or more of the simulations of the previous iteration.

The simulation system 300 can jointly train the policy neural network 306 and the discriminator neural network 310 based on logged environment data that characterizes the behavior of real-world agents interacting with a real-world environment. Parts of the logged environment data may be derived from sensor data generated by sensors (e.g., camera sensors, lidar sensors, radar sensors, and the like) of vehicles navigating real-world environments. In some cases, the logged environment data may be derived from sensor data of multiple vehicles navigating the same environment at the same time. Using sensor data derived from the sensors of multiple vehicles may enable the logged sensor data to characterize the environment more comprehensively and accurately, e.g., in situations where part of the environment is occluded from the perspective of one of the vehicles but not another. The simulation system 300 processes the logged environment data to generate representations of "real-world" environment states.

The logged environment data may be stored, e.g., in a geolocation-specific snapshot database or a geolocation-specific trajectory database. The geolocation-specific snapshot database may group log data per specific geolocation in the real world, so that log data collected in the same geolocation by different vehicles at different times is in the same geolocation-specific grouping. The geolocation-specific snapshot database can be queried for a given geolocation and provide all log data generated in the given geolocation. The geolocation-specific trajectory database may similarly group logged trajectory data (i.e., that characterizes agent trajectories), such that the database can be queried for a given geolocation and provide all trajectories that include the given geolocation. Geolocation-specific snapshot and trajectory databases are described further with reference to U.S. Patent Application No. 62/911,183, which is incorporated by reference herein. Storing the logged data in the geolocation-specific snapshot database and the geolocation-specific trajectory database can facilitate efficient retrieval of logged environment data for use in training the policy neural network and the discriminator neural network. For example, the geolocation-specific databases may enable efficient retrieval of logged data generated by multiple vehicles that were in the same vicinity at the same time. As described above, such data can be combined to characterize the environment more comprehensively and accurately, e.g., in situations where part of the environment is occluded from the perspective of one vehicle but not another.

The simulation system 300 trains the discriminator neural network to classify whether representations of environment states are: (i) simulation states generated by the simulation system in accordance with the current values of the policy network parameters, or (ii) real-world environment states derived from the logged environment data. For example, the simulation system 300 may train the discriminator neural network to generate the discriminative score value "1" for real-world environment states derived from the logged environment data, and the discriminative score value "0" for simulation states generated by the simulation system.

The simulation system 300 trains the policy neural network 306 to generate action probability distributions 318 that result in simulation states which are classified by the discriminator neural network 310 as being realistic, i.e., real-world environment states. For example, the simulation system 300 may use the policy neural network 306 to generate one or more candidate next simulation states that extend a current simulation state, and process representations of the generated candidate next simulation states using the discriminator neural network to generate corresponding discriminative scores. The simulation system 300 can then adjust the current values of the policy neural network parameters based on an objective function that depends on the discriminative scores.

The simulation system 300 can alternate between: (i) training the discriminator neural network using simulation states generated based on the latest values of the policy network parameters, and (ii) training the policy neural network using discriminative scores generated based on the latest values of the discriminator network parameters. Doing so encourages the policy neural network to become progressively better at selecting actions that result in realistic simulation states and encourages the discriminator neural network to continually adapt to identify unrealistic aspects of the simulation states being generated using the policy neural network. An example method for jointly training the policy neural network and the discriminator neural network is described with reference to: J. Ho, S. Ermon: "Generative adversarial imitation learning", $30^{th}$ Conference on Neural Information Processing Systems (NeurIPS), 2016. Another example method for jointly training the policy neural network and the discriminator neural network is described with reference to: J. Fu, K. Luo, S. Levine: "Learning robust rewards with adversarial inverse reinforcement learning", International Conference on Learning Representations (ICLR), 2018.

In some cases, the set of possible actions that can be performed by real-world agents differs from the set of possible actions that can be performed by simulated agents (i.e., that are controlled by the simulation system). For example, real-world agents can make steering angle adjustments drawn from a continuous range (e.g., the range $[0,2\pi]$ radians), while simulated agents may be restricted to making steering angle adjustments drawn from a finite set (e.g., a discretization of the range $[0,2\pi]$ radians into a finite number of bins). Differences between the respective sets of possible actions that can be performed by real-world agents and by simulated agents may compromise the training of the discriminator neural network. For example, a discriminator neural network may learn to discriminate between simulated states and real-world environment states by implicitly identifying whether the actions performed by the agents are drawn from continuous or finite sets. To avoid this outcome, the simulation may preprocess the logged environment data to map each of the actions performed by the real-world agents to the closest actions from set of possible actions that can be performed by the simulated agents.

FIG. 5 is a block diagram of an example observation embedding system 500. The observation embedding system 500 is an example of a system implemented as computer programs on one or more computers in one or more locations in which the systems, components, and techniques described below are implemented.

The observation embedding system 500 is configured to process a set of environment data 502 characterizing an environment and a current simulation state 504 characterizing the current state of each of multiple agents interacting with the environment to generate a respective observation embedding 506 for each agent.

The observation embedding system 500 processes the environment data 502 using an embedding neural network 508 to generate an environment embedding 510, i.e., an alternative representation of the environment data 502. The environment data 502 may include a road graph indicating the structure of the roadway being traveled by the agents, the states of objects in the environment (e.g., traffic light states), the trajectories of the agents up to the current time point, the current states of the agents, and the predicted future trajectories of the agents. The environment embedding 510 can be represented as a collection of point embeddings, where each point embedding is an ordered collection of numerical values corresponding to a respective spatial location in the environment. For example, the environment embedding 510 may be represented as an array of embeddings (e.g., 256-dimensional embeddings), where each embedding corresponds to a respective 2D or 3D spatial location in the environment (e.g., represented by (x, y) or (x, y, z) coordinates respectively). The embedding neural network can have any appropriate neural network architecture (e.g., a convolutional neural network architecture) that enables it to perform its described function.

The embedding neural network 508 may be jointly trained with the policy neural network and the discriminator neural network of the simulation system (described with reference to FIG. 3), e.g., by backpropagating gradients through the policy and discriminator neural networks into the embedding neural network 508. The embedding neural network 508 can also be trained using an objective function that directly depends on the environment embedding 510, e.g., that measures how accurately the environment data 502 can be reconstructed by processing the environment embedding 510.

For each agent, the observation embedding system 500 uses a coordinate transformation engine 512 to transform the coordinates of the respective spatial location associated with each point embedding of the environment embedding 510 from a predefined "global" coordinate system to an "agent-centric" coordinate system. The agent-centric coordinate system is defined relative to the state of the agent. For example, the coordinate transformation engine 512 may apply a translation operation to the spatial coordinates of the point embeddings to cause them to be centered on the spatial location of the agent. As another example, the coordinate transformation engine 512 may apply a rotation operation to map the heading of the agent to a predefined direction in the agent-centric coordinate system. The set of point embeddings and their associated spatial locations in the agent-centric coordinate system are referred as the "agent-centric embedding" 514. Generating the observation embedding 506 for the agent based on the agent-centric embedding 514, rather than the environment embedding 510, facilitates the training of the policy neural network and the discriminator neural network of the simulation system.

The observation embedding system 500 generates the respective observation embedding 506 for each agent based on the agent-centric embedding 514 corresponding to the agent. For example, to generate the observation embedding 506 for an agent, the observation embedding system 500 may apply a spatial pooling operation to the corresponding agent-centric embedding 514, and then process the pooled agent-centric embedding using one or more neural network layers to generate the observation embedding 506.

In some cases, certain regions of the environment may not be visible to an agent. For example, a region of the environment may not be visible to the agent as a result of the region being occluded by another agent or a static object in the environment (e.g., a safety barrier or a tree). Optionally, the observation embedding system 500 may prune point embeddings from the agent-centric embedding 514 for the agent that correspond to regions of the environment that are not visible to the agent, e.g., by replacing the point embeddings with default (predefined) embeddings. The observation embedding system 500 may determine that a region of the environment is not visible to an agent, e.g., if the line of sight of the agent to the region of the environment is blocked (e.g., by another agent or by a static object in the environment). Generating observation embeddings 506 based only on data from regions of the environment that are visible to the agent can enable the policy neural network of the simulation system to simulate the behavior of real-world agents more realistically.

In some implementations, rather than using an embedding neural network 508 to generate the environment embedding 510, the observation embedding system 500 may generate the environment embedding data 510 from the environment data 502 using a set of manually defined rules.

Figure 6:
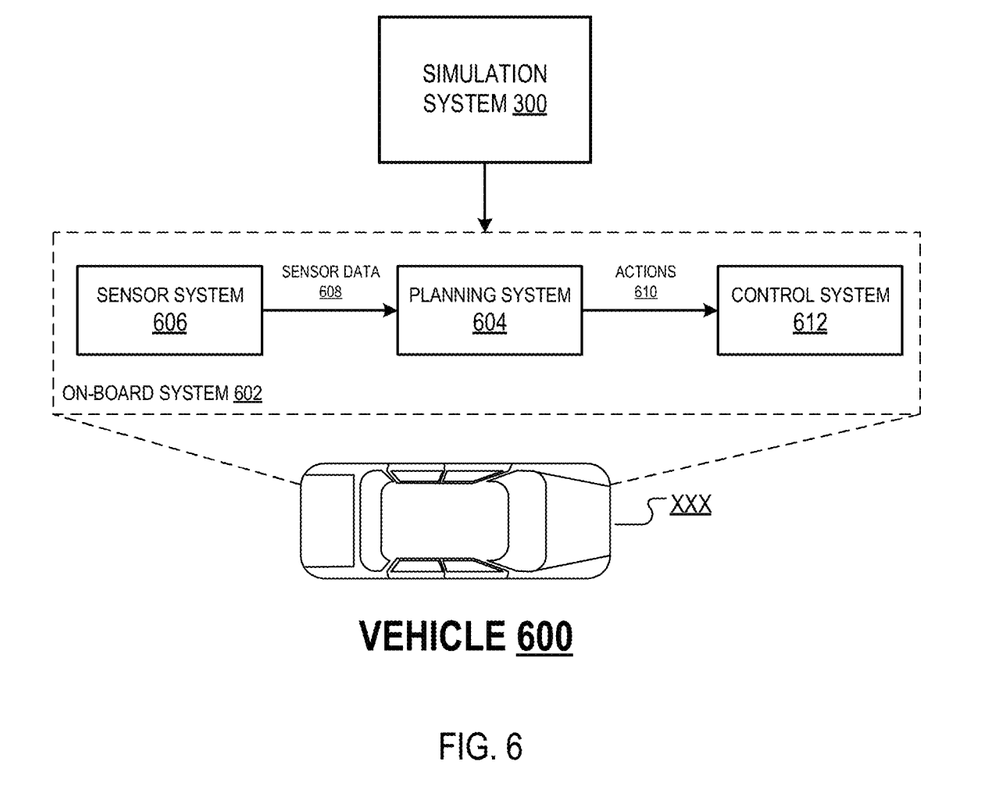
FIG. 6 is a block diagram of an example on-board system of a vehicle.

FIG. 6 is a block diagram of an example on-board system 602 of a vehicle 600. The on-board system 602 is composed of hardware and software components, some or all of which are physically located on-board the vehicle 600. The on-board system 602 uses a planning system 604 to plan the future trajectory of the vehicle and to select actions to be performed by the vehicle. The simulation system described in this specification can be used to train and test the planning system 604, as will be described in more detail below.

The on-board system 602 includes a sensor system 606 that generates sensor data 608 which enables the on-board system 602 to "see" the environment in the vicinity of the vehicle 600. More specifically, the sensor system 606 includes one or more sensors, some of which are configured to receive reflections of electromagnetic radiation from the environment in the vicinity of the vehicle 600. For example, the sensor system 606 can include one or more laser sensors (e.g., lidar laser sensors) that are configured to detect reflections of laser light. As another example, the sensor system 606 can include one or more radar sensors that are configured to detect reflections of radio waves. As another example, the sensor system 606 can include one or more camera sensors that are configured to detect reflections of visible light.

The sensor system 606 continually (i.e., at each of multiple time points) captures sensor data which can indicate the directions, intensities, and distances travelled by reflected radiation. For example, a sensor in the sensor system 606 can transmit one or more pulses of electromagnetic radiation in a particular direction and can measure the intensity of any reflections as well as the time that the reflection was received.

The planning system 604 is configured to use the sensor data 608 (in addition to other data, e.g., road-graph data) to generate planning decisions which plan the future trajectory of the vehicle, and in particular, to select actions to be performed by the vehicle. The actions 610 selected by the planning system 604 can be provided to a control system 612 of the vehicle 600. The control system 612 of the vehicle can control some or all of the operations of the vehicle by implementing the actions 610 selected by the planning system. For example, in response to the planning system 604 selecting an action specifying that the speed of the vehicle should be reduced, the control system 612 may transmit an electronic signal to a braking control unit of the vehicle. In response to receiving the electronic signal, the braking control unit can mechanically apply the brakes of the vehicle.

After being trained, the simulation system 300 can be used to safely and efficiently test the effectiveness of the planning system 604. For example, the planning system 604 can be used to control an agent in a simulated environment while one or more other agents in the simulated environment are controlled by simulation system 300 (using the policy and discriminator neural networks, as described earlier). Potential bugs in the planning system (e.g., where the planning system selects actions that cause the simulated agent to operate unsafely) can be identified by rolling out large numbers simulations and identifying where the planning system fails.

The planning system 604 may be jointly trained with the simulation system 300 using machine learning techniques. For example, the planning system 604 and the simulation system 300 can be jointly trained by rolling out a large number of simulations where the planning system 604 controls one agent in the simulated environment, and the simulation system 300 controls the remaining agents (as described earlier). The planning system 604 may be trained to optimize an objective function that characterizes whether vehicle controlled by the planning system 604 efficiently achieves its objectives (e.g., navigating from point A to point B) while operating safely. The simulation system 300 (in particular, the policy and discriminator neural networks) may be trained to realistically simulate the behavior of the other agents based on a set of logged real-world data, as described earlier. Jointly training the planning system 604 along with the simulation system 300 may enable the planning system 604 to learn to control the vehicle 600 more safely and efficiently.

The simulation system 300 may also be implemented by the on-board system 602 of the vehicle and used by the planning system 604 of the vehicle to perform behavior prediction for other agents in the vicinity of the vehicle. For example, prior to selecting an action to be performed by the vehicle at a time point, the planning system 604 may use the simulation system 300 to roll out simulations that predict the future behavior of the other agents in the vicinity of the vehicle over a duration of time (e.g., 5 seconds). The planning system 604 may take the predicted future behavior of the other agents into account when selecting the action to be performed by the vehicle.

Figure 7:
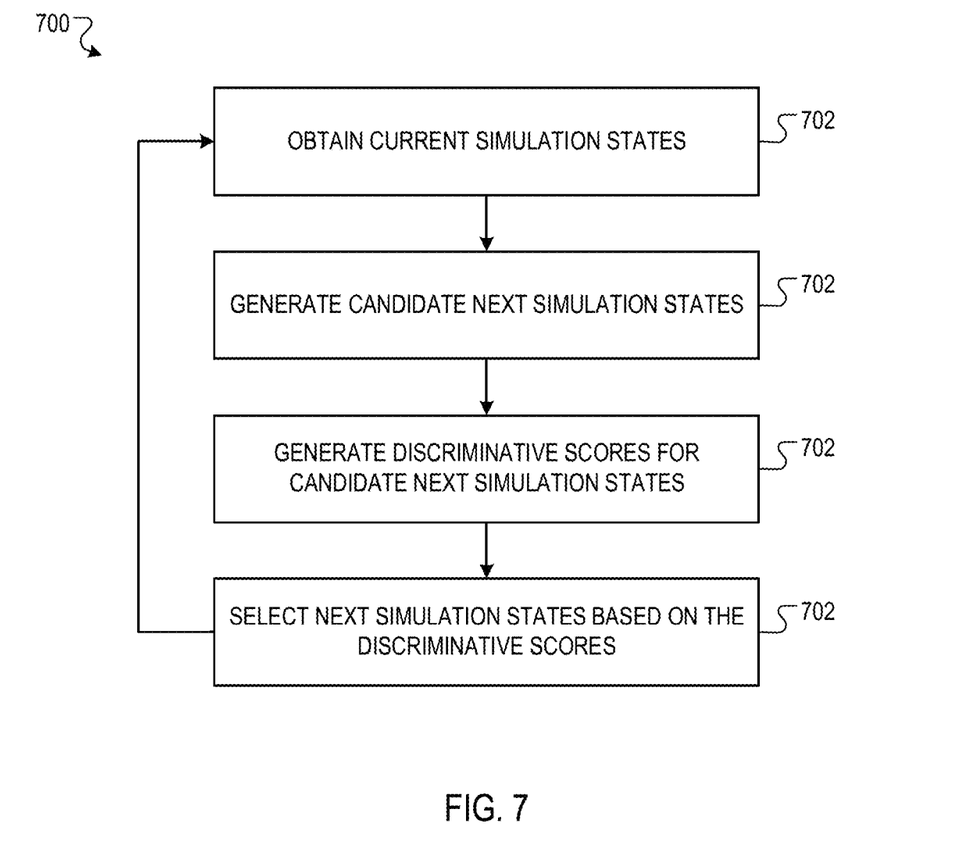
FIG. 7 is a flow diagram of an example process for generating a simulation of an environment being interacted with by multiple agents.

FIG. 7 is a flow diagram of an example process 700 for generating a simulation of an environment being interacted with by multiple agents. For convenience, the process 700 will be described as being performed by a system of one or more computers located in one or more locations. For example, a simulation system, e.g., the simulation system 300 of FIG. 3, appropriately programmed in accordance with this specification, can perform the process 700.

The system obtains one or more current simulations state for the current time step (702). If the current time step is the first time step, the system may obtain the current simulation state from a set of logged environment data characterizing the state of a real-world environment. If the current time step is after the first time step, the system may obtain the simulation states generated for the current time step at the previous time step. Generally, a simulation state for a time step specifies a respective state of each agent at the time step.

In one example, the agents are vehicles, and the state of an agent at a time step specifies the position (e.g., spatial location and heading) of the agent and the motion (e.g., speed and acceleration) of the agent at the time step.

The system generates a set of candidate next simulation states for the next time step based on the current simulation states (704). To generate a candidate next simulation state that extends a current simulation state, the system generates a respective probability distribution over a set of possible actions for each agent. The system may generate the action probability distribution for an agent by processing a representation of the current state of the agent in the environment (sometimes referred to as an "observation embedding") using a policy neural network. The system then samples a respective action for each agent using the probability distribution corresponding to the agent, and determines the next state of the agent at the next time step if the agent performs the sampled action at the current time step using a motion model. The set of possible actions may include, e.g., actions that adjust the steering angle of the agent and actions that adjust the acceleration of the agent.

The system generates a respective discriminative score for each candidate next simulation state (706). The discriminative score for a candidate next simulation state characterizes the likelihood that the candidate next simulation state is a realistic simulation state. The system can generate the discriminative score for a candidate next simulation state by processing a representation of the candidate next simulation state using a discriminator neural network. The discriminator neural network is trained to generate discriminative scores that characterize an environment state as being realistic if the environment state is a real-world environment state. The system may generate the representation of a candidate next simulation state by obtaining, for each agent, a representation of the next state of the agent at the next time step corresponding to the candidate next simulation state. To generate the discriminative score for the candidate next simulation state, the system may generate an agent-specific discriminative score for each agent by processing the representation of the next state of the agent corresponding to the candidate next simulation state using the discriminator neural network. The agent-specific discriminative score for an agent characterizes the likelihood that the next stage of the agent is a realistic agent state. The system may then generate the overall discriminative score for the candidate next simulation state based on the agent-specific discriminative scores for the candidate next simulation state, e.g., based on the minimum of the agent-specific discriminative scores.

The system selects one or more of the candidate next simulation states as simulation states for the next time step based on the discriminative scores (708). For example, the system may select a predefined number of candidate next simulation states having the highest discriminative scores as the simulation states for the next time step. If the current time step is not the final time step, the system can advance to the next time step and return to step 702. If the current time step is the final time step, the system can output one or more simulations of the environment based on the simulation states generated for each time step.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method performed by one or more data processing apparatus for generating a simulation of an environment that is being interacted with by a plurality of agents over a plurality of time steps, wherein the simulation comprises a respective simulation state for each time step that specifies a respective state of each agent at the time step, the method comprising, for each time step:
   obtaining a current simulation state for the current time step;
   generating a plurality of candidate next simulation states for a next time step based on the current simulation state, wherein generating each candidate next simulation state comprises:
      sampling, for each agent, a respective action from a set of possible actions that can be performed by the agent; and
      determining, for each agent, a respective next state of the agent at the next time step if the agent performs the corresponding sampled action at the current time step;
   determining, for each candidate next simulation state, a discriminative score characterizing a likelihood that the candidate next simulation state is a realistic simulation state, comprising:
   for each agent, generating an agent-specific discriminative score characterizing a likelihood that the next state of the agent is a realistic agent state; and
   generating the discriminative score characterizing the likelihood that the candidate next simulation state is a realistic simulation state based on the agent-specific discriminative scores; and
   selecting a candidate next simulation state as the simulation state for the next time step based on the discriminative scores for the candidate next simulation states.

2. The method of claim 1, wherein the agents are vehicles in the environment.

3. The method of claim 2, wherein the set of possible actions that can be performed by an agent comprise actions that adjust a steering angle of the agent.

4. The method of claim 2, wherein the set of possible actions that can be performed by an agent comprise actions that adjust an acceleration of the agent.

5. The method of claim 1, wherein the state of an agent at a time step comprises: (i) a position of the agent at the time step, and (ii) a motion of the agent at the time step.

6. The method of claim 5, wherein the position of the agent comprises: (i) a spatial location of the agent in the environment, and (ii) a heading of the agent in the environment.

7. The method of claim 5, wherein the motion of the agent comprises: (i) a speed of the agent, and (ii) an acceleration of the agent.

8. The method of claim 1, further comprising, for each agent:
   obtaining a representation of the current state of the agent in the environment; and
   processing the representation of the current state of the agent in the environment using a policy neural network to generate a corresponding probability distribution over the set of possible actions for the agent;
   wherein sampling, for each agent, a respective action from the set of possible actions comprises, for each agent:
      sampling an action from the set of possible actions in accordance with the probability distribution over the set of possible actions for the agent.

9. The method of claim 1, wherein determining, for each agent, a respective next state of the agent at the next time step if the agent performs the corresponding sampled action at the current time step comprises, for each agent:
   processing data characterizing: (i) a current state of the agent, and (ii) the sampled action for the agent, using a motion model to generate the next state of the agent at the next time step.

10. The method of claim 1, wherein:
   for each agent, generating an agent-specific discriminative score characterizing a likelihood that the next state of the agent is a realistic agent state comprises:
   obtaining, for each agent, a representation of the next state of the agent at the next time step corresponding to the candidate next simulation state; and
   processing, for each agent, the representation of the next state of the agent at the next time step corresponding to the candidate next simulation state using a discriminator neural network to generate an agent-specific discriminative score characterizing a likelihood that the next state of the agent is a realistic agent state.

11. The method of claim 10, wherein generating the discriminative score characterizing the likelihood that the candidate next simulation state is a realistic simulation state based on the agent-specific discriminative scores comprises:
   computing a minimum of the agent-specific discriminative scores.

12. The method of claim 10, wherein the discriminator neural network is trained to generate discriminative scores that characterize an environment state as being realistic if the environment state is a real-world environment state.

13. The method of claim 1, wherein selecting a candidate next simulation state as the simulation state for the next time step based on the discriminative scores for the candidate next simulation states comprises:
   selecting the candidate next simulation state with the highest discriminative score as the simulation state for the next time step.

14. A system comprising:
   one or more computers; and
   one or more storage devices communicatively coupled to the one or more computers, wherein the one or more storage devices store instructions that, when executed by the one or more computers, cause the one or more computers to perform operations for generating a simulation of an environment that is being interacted with by a plurality of agents over a plurality of time steps, wherein the simulation comprises a respective simulation state for each time step that specifies a respective state of each agent at the time step, the operations comprising, for each time step:
   obtaining a current simulation state for the current time step;
   generating a plurality of candidate next simulation states for a next time step based on the current simulation state, wherein generating each candidate next simulation state comprises:
      sampling, for each agent, a respective action from a set of possible actions that can be performed by the agent; and
      determining, for each agent, a respective next state of the agent at the next time step if the agent performs the corresponding sampled action at the current time step;

determining, for each candidate next simulation state, a discriminative score characterizing a likelihood that the candidate next simulation state is a realistic simulation state, comprising:
for each agent, generating an agent-specific discriminative score characterizing a likelihood that the next state of the agent is a realistic agent state; and
generating the discriminative score characterizing the likelihood that the candidate next simulation state is a realistic simulation state based on the agent-specific discriminative scores; and
selecting a candidate next simulation state as the simulation state for the next time step based on the discriminative scores for the candidate next simulation states.

15. The system of claim 14, wherein the agents are vehicles in the environment.

16. The system of claim 15, wherein the set of possible actions that can be performed by an agent comprise actions that adjust a steering angle of the agent.

17. The system of claim 15, wherein the set of possible actions that can be performed by an agent comprise actions that adjust an acceleration of the agent.

18. One or more non-transitory computer storage media storing instructions that when executed by one or more computers cause the one or more computers to perform operations for generating a simulation of an environment that is being interacted with by a plurality of agents over a plurality of time steps, wherein the simulation comprises a respective simulation state for each time step that specifies a respective state of each agent at the time step, the operations comprising, for each time step:
obtaining a current simulation state for the current time step;
generating a plurality of candidate next simulation states for a next time step based on the current simulation state, wherein generating each candidate next simulation state comprises:
sampling, for each agent, a respective action from a set of possible actions that can be performed by the agent; and
determining, for each agent, a respective next state of the agent at the next time step if the agent performs the corresponding sampled action at the current time step;
determining, for each candidate next simulation state, a discriminative score characterizing a likelihood that the candidate next simulation state is a realistic simulation state, comprising:
for each agent, generating an agent-specific discriminative score characterizing a likelihood that the next state of the agent is a realistic agent state; and
generating the discriminative score characterizing the likelihood that the candidate next simulation state is a realistic simulation state based on the agent-specific discriminative scores; and
selecting a candidate next simulation state as the simulation state for the next time step based on the discriminative scores for the candidate next simulation states.

19. The non-transitory computer storage media of claim 18, wherein the agents are vehicles in the environment.

20. The system of claim 14, wherein:
for each agent, generating an agent-specific discriminative score characterizing a likelihood that the next state of the agent is a realistic agent state comprises:
obtaining, for each agent, a representation of the next state of the agent at the next time step corresponding to the candidate next simulation state; and
processing, for each agent, the representation of the next state of the agent at the next time step corresponding to the candidate next simulation state using a discriminator neural network to generate an agent-specific discriminative score characterizing a likelihood that the next state of the agent is a realistic agent state.

* * * * *